(12) United States Patent
Zumbek (10) Patent No.: US 11,266,028 B2
(45) Date of Patent: Mar. 1, 2022

(54) FAUX COLUMN INTERMEDIATE DISTRIBUTION FRAME ENCLOSURE

(71) Applicant: Panduit Corp., Tinley Park, IL (US)

(72) Inventor: Kevin M. Zumbek, Chicago, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 17/082,599

(22) Filed: Oct. 28, 2020

(65) Prior Publication Data

US 2021/0045255 A1 Feb. 11, 2021

Related U.S. Application Data

(63) Continuation of application No. 16/028,506, filed on Jul. 6, 2018, now abandoned.

(60) Provisional application No. 62/532,479, filed on Jul. 14, 2017.

(51) Int. Cl.
| | |
|---|---|
| *H05K 5/00* | (2006.01) |
| *H05K 5/02* | (2006.01) |
| *H05K 7/18* | (2006.01) |
| *H05K 7/20* | (2006.01) |
| *H05K 7/14* | (2006.01) |
| *H04Q 1/02* | (2006.01) |
| *H04Q 1/08* | (2006.01) |

(52) U.S. Cl.
CPC .......... *H05K 5/0004* (2013.01); *H04Q 1/025* (2013.01); *H04Q 1/08* (2013.01); *H05K 5/0213* (2013.01); *H05K 5/0239* (2013.01); *H05K 7/1488* (2013.01); *H05K 7/18* (2013.01); *H05K 7/20736* (2013.01)

(58) Field of Classification Search
CPC .......... H05K 5/00; H05K 5/02; H05K 5/0217; H05K 5/04; H05K 7/183; H05K 7/186; H05K 2201/10454; H05K 2201/10522; H05K 7/18; H05K 7/14; H05K 7/1417; H05K 7/16; H05K 7/1487; H05K 7/1489; H05K 7/1425; H05K 5/0004; H05K 5/0204; H05K 5/0213; H05K 5/0239; H05K 7/1488; H05K 7/20736; A47B 47/0058; A47B 47/0083; A47B 47/021; H04Q 1/025; H04Q 1/08
See application file for complete search history.

(56) References Cited

U.S. PATENT DOCUMENTS

| | | |
|---|---|---|
| 5,286,919 A | 2/1994 | Benson et al. |
| 6,164,639 A | 12/2000 | Toh et al. |
| 6,185,098 B1 | 2/2001 | Benavides |

(Continued)

FOREIGN PATENT DOCUMENTS

| | | |
|---|---|---|
| EP | 1835583 A2 | 9/2007 |
| EP | 3429218 B1 | 1/2019 |
| WO | 2009058928 A1 | 5/2009 |

*Primary Examiner* — Michael A Matey
(74) *Attorney, Agent, or Firm* — Christopher S. Clancy; James H. Williams; Aimee E. McVady (57) ABSTRACT

A vertical column assembly including an intermediate distribution frame enclosure with an internal structure. The vertical column assembly also includes side panels, door assemblies, and a top cover assembly. The internal structure is hidden by the side panels, the door assemblies, and the top cover assembly. The vertical column assembly encases the network equipment installed within the internal structure.

18 Claims, 14 Drawing Sheets

(56) References Cited

U.S. PATENT DOCUMENTS

| | | | |
|---|---|---|---|
| 6,293,637 B1* | 9/2001 | Anderson | H02B 1/301 211/26 |
| 6,416,339 B1 | 7/2002 | Snow et al. | |
| 6,574,970 B2 | 6/2003 | Spinazzola et al. | |
| 6,889,752 B2 | 5/2005 | Stoller | |
| 7,033,267 B2 | 4/2006 | Rasmussen | |
| 7,112,131 B2 | 9/2006 | Rasmussen et al. | |
| 7,359,612 B1* | 4/2008 | Bjorklund | G02B 6/4452 385/134 |
| 7,438,638 B2 | 10/2008 | Lewis, II et al. | |
| 7,542,287 B2 | 6/2009 | Lewis, II et al. | |
| 7,578,733 B2 | 8/2009 | Belady et al. | |
| 7,697,285 B2 | 4/2010 | Donowho et al. | |
| 7,746,637 B2 | 6/2010 | Donowho et al. | |
| 7,804,685 B2 | 9/2010 | Krietzman | |
| 7,839,635 B2 | 11/2010 | Donowho et al. | |
| 7,862,410 B2 | 1/2011 | McMahan et al. | |
| 7,878,888 B2 | 2/2011 | Rasmussen et al. | |
| 7,894,190 B2 | 2/2011 | Davis et al. | |
| 7,952,869 B2 | 5/2011 | Lewis, II et al. | |
| 7,957,139 B2 | 6/2011 | Davis et al. | |
| 7,974,105 B2 | 7/2011 | Dean, Jr. et al. | |
| 8,003,890 B2 | 8/2011 | Donowho et al. | |
| 8,040,673 B2 | 10/2011 | Krietzman | |
| 8,107,238 B2 | 1/2012 | Krietzman et al. | |
| 8,210,914 B2 | 7/2012 | McMahan et al. | |
| 8,279,602 B2 | 10/2012 | Sivanandan et al. | |
| 8,289,717 B2 | 10/2012 | Heimann et al. | |
| 8,405,984 B2 | 3/2013 | Donowho et al. | |
| 8,411,465 B2 | 4/2013 | Dean, Jr. et al. | |
| 8,437,147 B2 | 5/2013 | Dean, Jr. et al. | |
| 8,558,113 B2* | 10/2013 | Krietzman | H02G 3/0475 174/72 A |
| 8,653,363 B2 | 2/2014 | Behrens et al. | |
| 8,730,665 B2 | 5/2014 | Lewis, II et al. | |
| 8,737,068 B2 | 5/2014 | Krietzman et al. | |
| 8,901,438 B2* | 12/2014 | Lewis, II | H05K 7/183 174/559 |
| 8,925,739 B2 | 1/2015 | Crippen et al. | |
| 9,055,677 B2 | 6/2015 | Garza, Jr. et al. | |
| 9,084,369 B2 | 7/2015 | Lewis, II et al. | |
| 9,119,329 B2 | 8/2015 | Krietzman et al. | |
| 9,307,836 B2 | 4/2016 | Arflack et al. | |
| 9,351,427 B2 | 5/2016 | Lewis, II et al. | |
| 9,420,727 B2 | 8/2016 | Lewis, II et al. | |
| 9,549,487 B2 | 1/2017 | Lewis, II et al. | |
| 9,609,788 B2 | 3/2017 | Kawamoto et al. | |
| 9,642,270 B2 | 5/2017 | Lewis, II et al. | |
| 10,524,394 B2* | 12/2019 | Bravo | H05K 7/1489 |
| 2004/0183409 A1 | 9/2004 | Rinderer | H05K 7/1421 312/265.4 |
| 2005/0068716 A1* | 3/2005 | Pereira | H05K 7/1457 361/624 |
| 2005/0083651 A1* | 4/2005 | Smith | H05K 7/20736 361/679.48 |
| 2005/0217880 A1 | 10/2005 | Marcotte et al. | |
| 2006/0043031 A1* | 3/2006 | Rinderer | H05K 7/186 211/26 |
| 2006/0059802 A1 | 3/2006 | McNutt et al. | |
| 2006/0141921 A1* | 6/2006 | Turek | H05K 7/20572 454/184 |
| 2006/0269207 A1 | 11/2006 | Ivancevic | |
| 2007/0171613 A1 | 7/2007 | McMahan et al. | |
| 2007/0258211 A1 | 11/2007 | Sonobe et al. | |
| 2007/0278915 A1* | 12/2007 | Conrardy | H01M 50/20 312/257.1 |
| 2007/0293138 A1* | 12/2007 | Adducci | H04Q 1/026 454/184 |
| 2009/0014614 A1* | 1/2009 | Warmoth | H05K 7/1489 248/309.1 |
| 2009/0086441 A1 | 4/2009 | Randall et al. | |
| 2009/0147944 A1* | 6/2009 | McSorley | H04Q 1/13 379/454 |
| 2010/0006317 A1* | 1/2010 | Hruby | H04Q 1/064 174/97 |
| 2010/0195694 A1 | 8/2010 | Claassen et al. | |
| 2010/0219726 A1* | 9/2010 | Nicewicz | H02G 3/32 312/223.2 |
| 2011/0268411 A1* | 11/2011 | Giraud | G02B 6/4452 385/135 |
| 2011/0316402 A1* | 12/2011 | Hsiao | H05K 7/1488 312/326 |
| 2012/0032572 A1 | 2/2012 | Lee | |
| 2012/0062084 A1* | 3/2012 | Lewis, II | A47B 47/00 312/223.6 |
| 2012/0069514 A1* | 3/2012 | Ross | H05K 7/20727 361/679.33 |
| 2012/0273438 A1* | 11/2012 | Nordin | H05K 7/1491 211/26 |
| 2012/0293932 A1 | 11/2012 | Jai | |
| 2013/0194772 A1 | 8/2013 | Rojo et al. | |
| 2013/0267160 A1 | 10/2013 | Hung | |
| 2013/0342091 A1* | 12/2013 | Walker | H05K 5/02 312/265.5 |
| 2014/0027392 A1* | 1/2014 | Crippen | H05K 7/1488 211/26 |
| 2014/0049146 A1 | 2/2014 | Kamaludeen et al. | |
| 2014/0153169 A1* | 6/2014 | Kohonen | H05K 7/186 361/679.01 |
| 2014/0238639 A1 | 8/2014 | Ambriz et al. | |
| 2014/0345238 A1 | 11/2014 | Jun et al. | |
| 2015/0008198 A1* | 1/2015 | Chappell | H05K 7/183 211/26 |
| 2015/0173253 A1* | 6/2015 | Lewis, II | H05K 5/0004 312/223.2 |
| 2015/0333303 A1* | 11/2015 | Hachiya | H01M 50/502 429/90 |
| 2016/0262277 A1 | 9/2016 | Lewis, II et al. | |
| 2016/0302317 A1 | 10/2016 | Lewis, II et al. | |
| 2016/0302323 A1* | 10/2016 | Gosselin | H05K 7/20736 |
| 2017/0094827 A1* | 3/2017 | Wilson | H05K 7/183 |
| 2017/0127570 A1 | 5/2017 | Lewis, II et al. | |
| 2017/0149228 A1 | 5/2017 | Pawluk | |
| 2017/0150636 A1* | 5/2017 | Segroves | H05K 7/20836 |
| 2018/0171674 A1* | 6/2018 | AbuGhazaleh | H05K 7/1488 |
| 2018/0205247 A1* | 7/2018 | Maguire | H02J 7/0042 |
| 2019/0246513 A1* | 8/2019 | Chen | A47B 81/00 |

* cited by examiner

FAUX COLUMN INTERMEDIATE DISTRIBUTION FRAME ENCLOSURE

CROSS REFERENCE TO RELATED APPLICATIONS

This application is a continuation of U.S. patent application Ser. No. 16/028,506, filed Jul. 6, 2018, which claims priority to U.S. Provisional Application No. 62/532,479, filed Jul. 14, 2017, the subject matter of which is hereby incorporated by reference in its entirety.

FIELD OF THE INVENTION

The present invention relates to an enclosure, and more particularly, to an enclosure for encasing and securing rack mountable equipment.

BACKGROUND OF THE INVENTION

Large buildings typically employ a zone cabling layout for the Local Area Network (LAN). In this layout, end user devices are cabled through an Intermediate Distribution Frame (IDF) before connecting to the Main Distribution Frame (MDF). An IDF can be an open rack installed in a local telecommunication closet or an enclosure that is hidden within a drop ceiling or under a raised floor. An IDF may encase active equipment, therefore the IDF is required to allow for sufficient ventilation.

Some office environments lack a raised floor and drop ceiling, or have a drop ceiling with limited space, or have limited floor space to accommodate a telecommunications closet. It may also be preferable to have networking equipment installed in a more accessible area other than the floor or ceiling. Current solutions exist for housing and connecting cabling and active networking equipment within the office area or workspace. The current solutions include free standing cabinets or wall mounted cabinets. The free-standing cabinet and wall mount cabinets are bulky, do not isolate unwanted noise, and do not integrate well with the aesthetics or architectural design of an office interior.

Many office environments hide electrical cabling, plumbing, or other building infrastructure components within faux vertical columns. These columns are typically constructed of drywall or wood and may not allow easy access to the components inside. The current faux vertical columns are not designed to house active networking equipment due to a lack of ventilation and an access door.

It would be desirable to provide an enclosure that supports zone LAN cabling and active networking equipment that has a smaller footprint and a more disguised appearance than current free-standing cabinets and wall mounts cabinets. It would be desirable to provide a faux vertical column with ventilation, locking access doors, sound isolation, and standard mounting rails to employ an enclosed IDF within an office workspace.

SUMMARY OF THE INVENTION

A vertical column assembly including an intermediate distribution frame enclosure with an internal structure that supports cabling and active network equipment. The vertical column assembly includes side panels, door assemblies and a top cover assembly. The internal structure is hidden by the side panels, the door assemblies, and the top cover assembly.

An enclosure assembly that encases network equipment installed in an intermediate distribution frame within an office workspace. The enclosure assembly includes an intermediate distribution frame enclosure with an internal structure having network equipment mounted therein. The internal structure has at least one mounting bracket positioned at a corner of the internal structure. The enclosure assembly also includes at least one door assembly, side panels mounted to the internal structure, and a top cover assembly covering a top of the internal structure. The door assembly is mounted to the at least one mounting bracket. That door assembly includes a perforated vent to ventilate heat generate by the network equipment.

DETAILED DESCRIPTION

Figure 1:
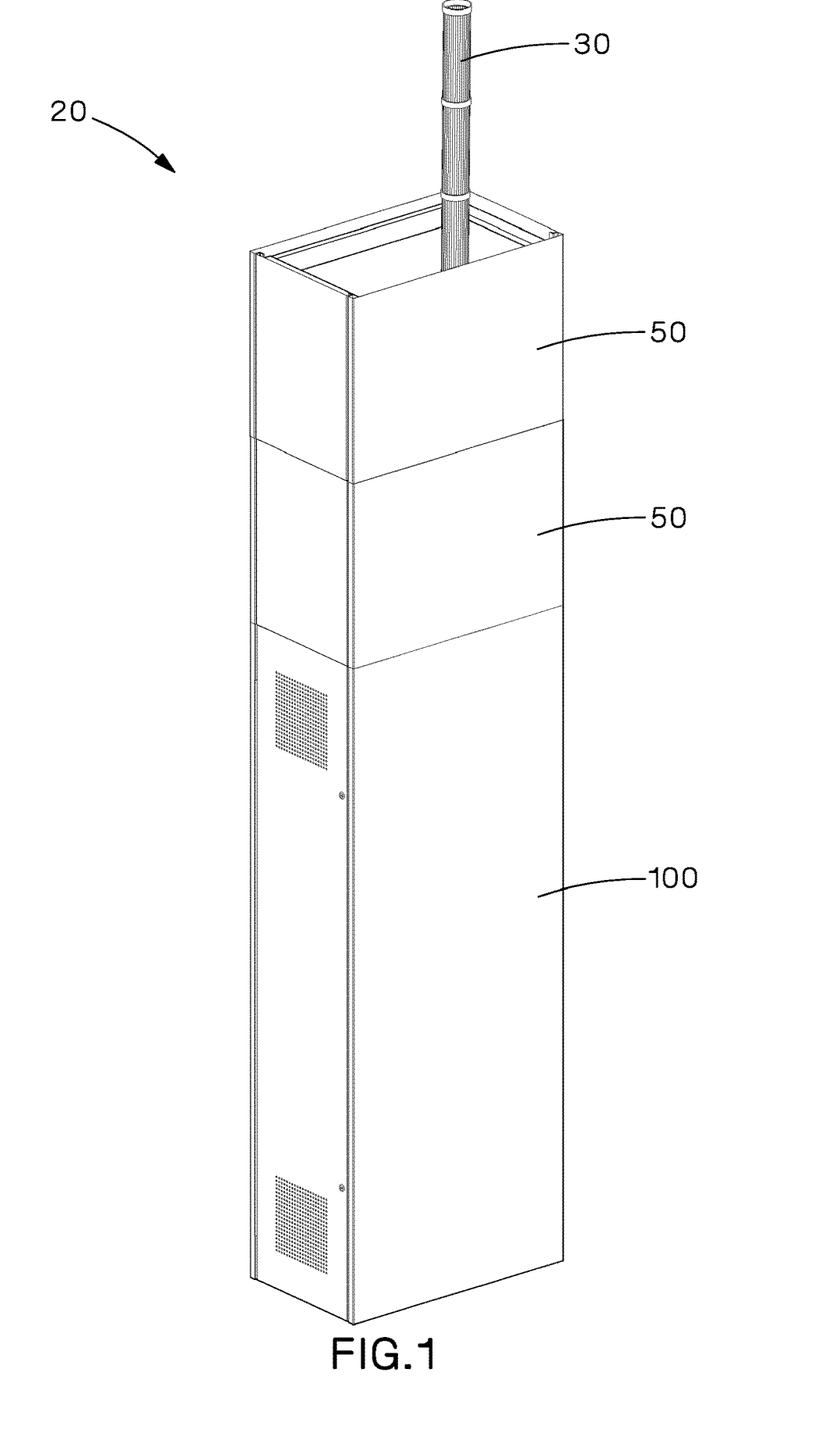
FIG. 1 is a trimetric view of a faux column IDF enclosure and vertical extensions of the present invention.
Figure 2:
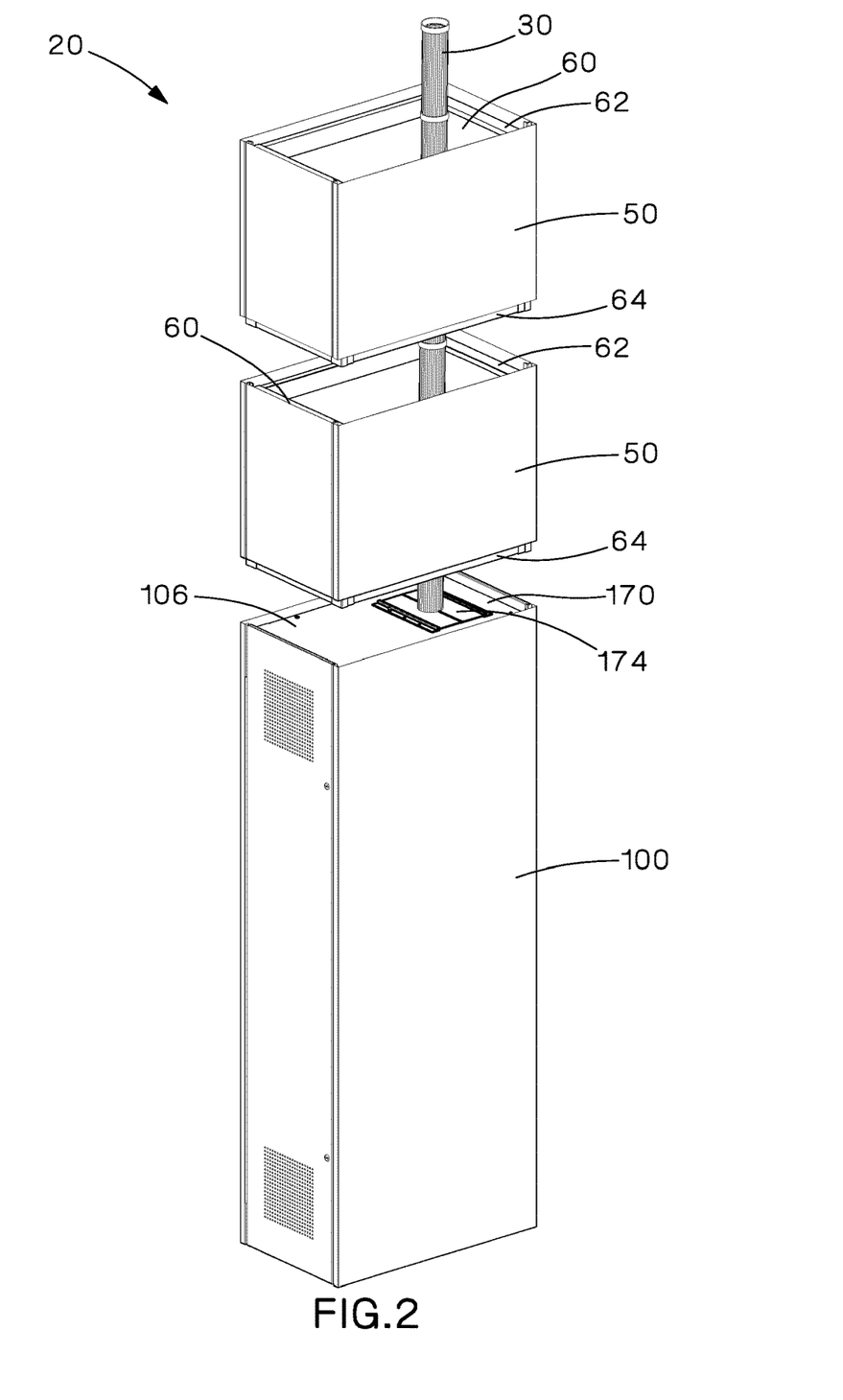
FIG. 2 is an exploded view of the faux column IDF enclosure and vertical extensions of FIG. 1.

FIG. 1 illustrates a column 20 that includes a network cable bundle 30, vertical extensions 50, and a faux column IDF enclosure 100. FIG. 2 is an exploded view of the column. The network cable bundle 30 passes through the vertical extensions 50 before entering the top of the faux column IDF enclosure 100. The vertical extensions 50 hide the network cable bundle 30. The vertical extensions 50 are stackable and can be used in any non-limiting quantity, including none, as needed to extend to the ceiling and hide the full vertical length of the network cable bundle 30.

Each vertical extension 50 is a hollow rectangular shell 60 with an upper indentation or receiving area 62 and a lower projection 64 that extend the perimeter of the shell 60. The lowest projection 64 is secured to the faux column IDF enclosure 100 with bolts (not shown). The remainder of the column 20 is created by stacking one vertical extension 50 at a time, as needed. Threaded rods (not shown) secure the uppermost vertical extension 50 to the ceiling to provide stability to the column 20, as necessary.

The outer appearance of the vertical extensions 50 matches the faux column IDF enclosure 100 to provide a column 20 with continuous lines throughout the height of the column 20.

Figure 3:
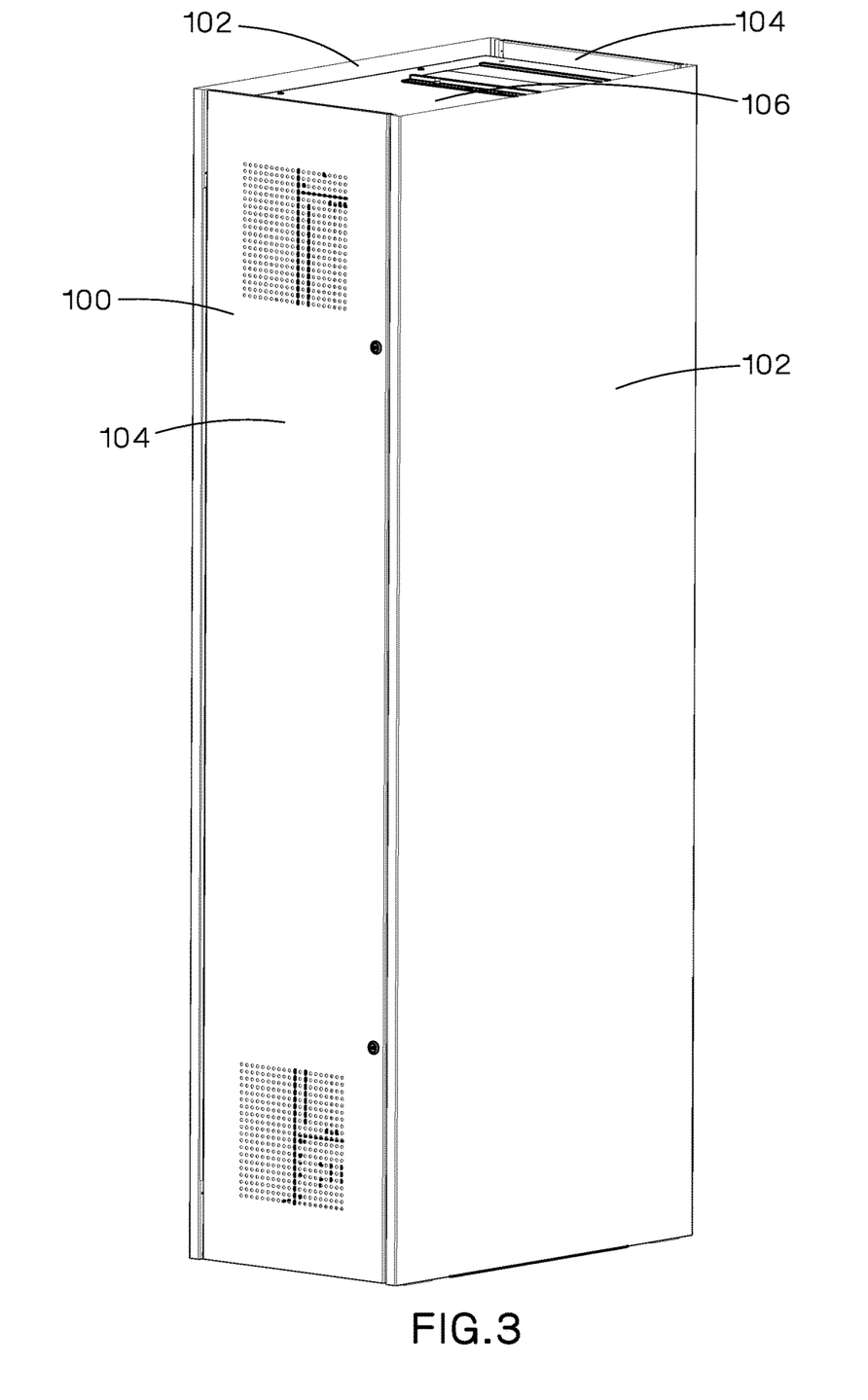
FIG. 3 is a trimetric view of the faux column IDF enclosure of FIG. 1.

FIG. 3 illustrates the faux column IDF enclosure 100 with side panels 102, door assemblies 104 and a top cover assembly 106. The side panels 102, door assemblies 104, and vertical extensions 50 may be painted to match the aesthetics of the office interior. The side panels 102 do not present any lines, bends, or holes on the side surface of the faux column IDF enclosure 100 to contribute to a plain and flat appearance.

Figure 4:
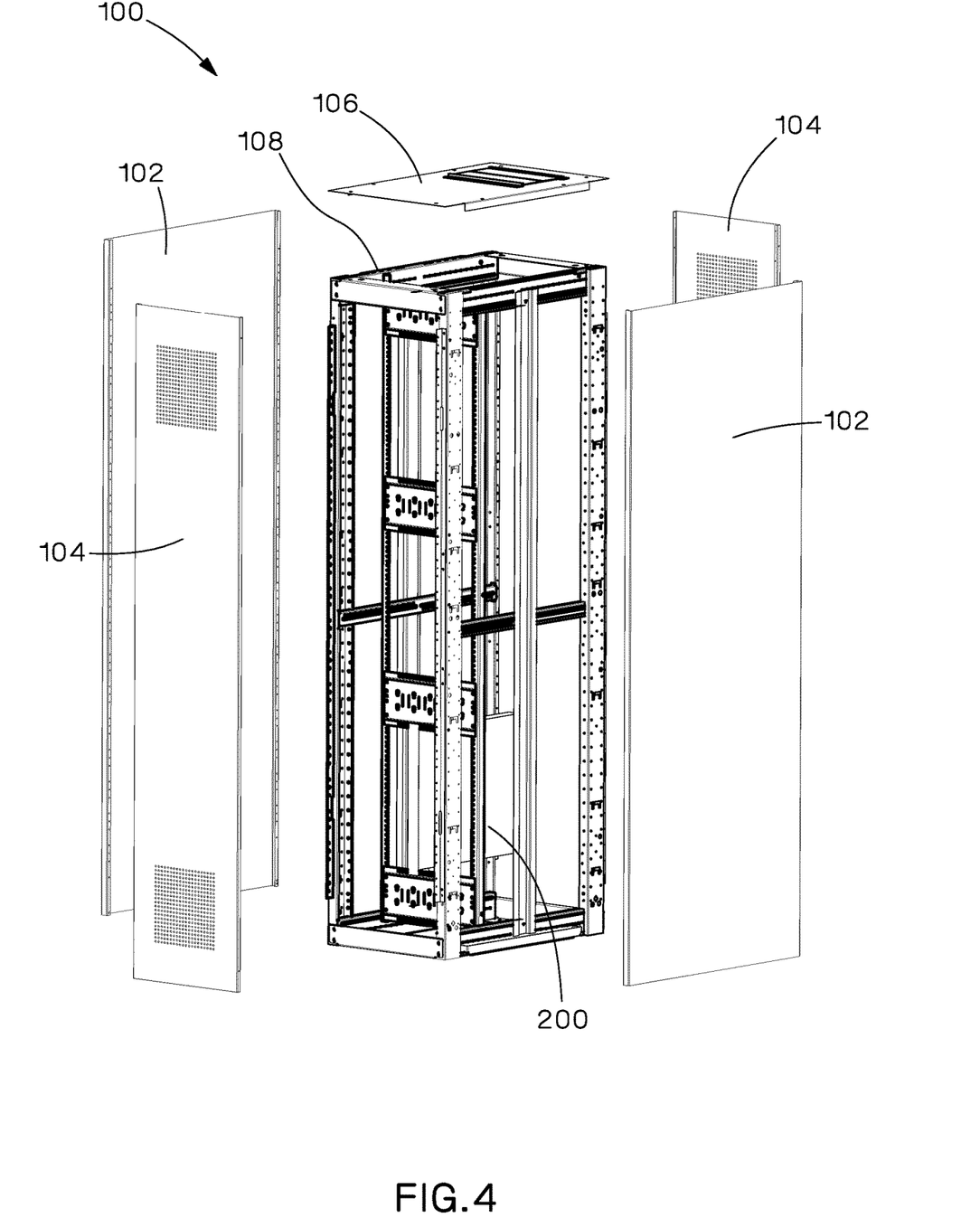
FIG. 4 is a partially exploded view of the faux column IDF enclosure of FIG. 3 with the side panels and doors removed.

FIG. 4 illustrates the faux column IDF enclosure 100 with the side panels 102 and the door assemblies 104 being removed to illustrate the internal structure 108 of the faux column IDF enclosure 100. The internal structure 108 is hidden from view which contributes to the plain appearance of the faux column IDF enclosure 100. The internal structure 108 contains network equipment 200 that is mounted vertically. The network equipment 200 is completely enclosed by the side panels 102, the door assemblies 104, the top cover assembly 106, and the room floor to isolate the noise.

Figure 5:
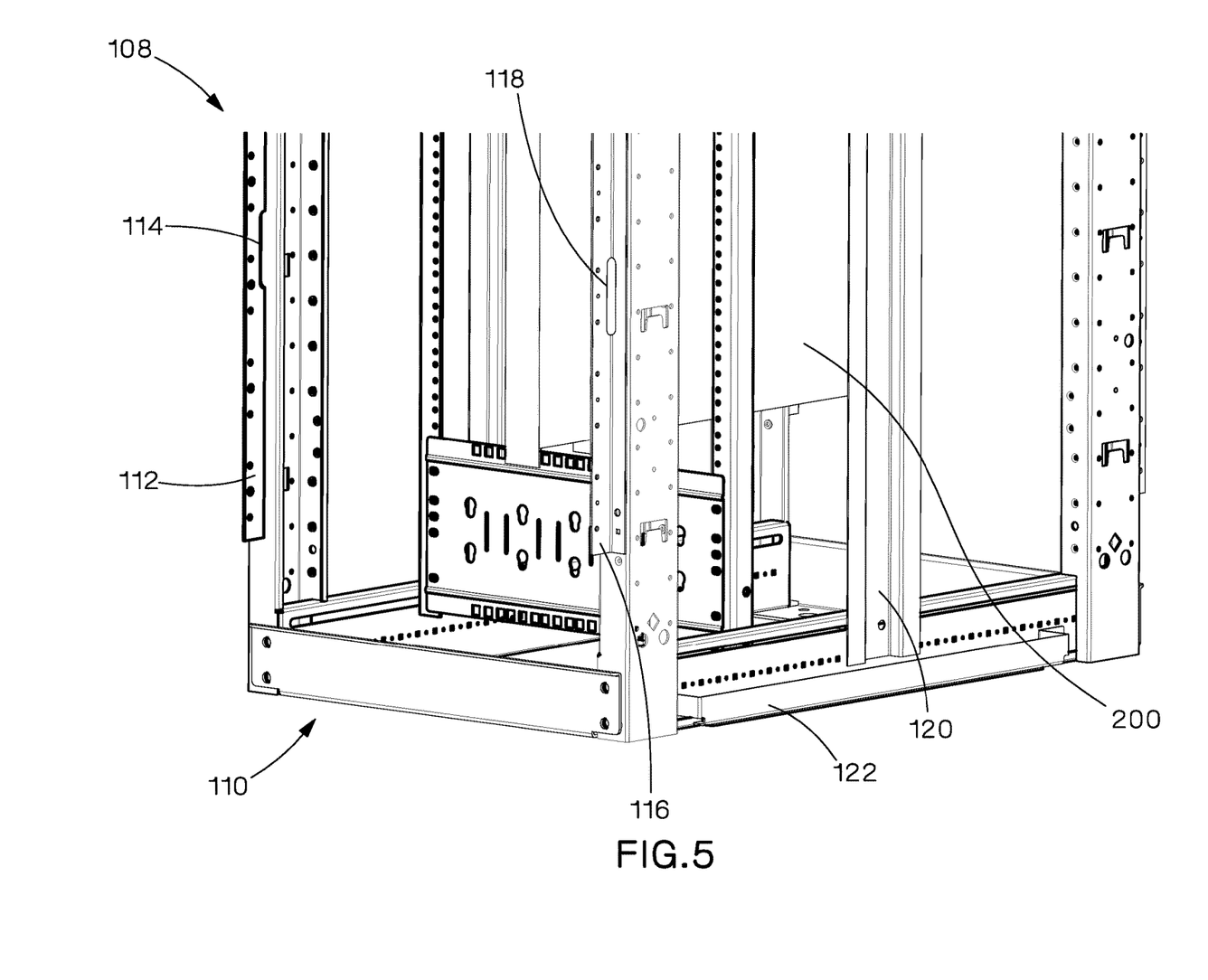
FIG. 5 is a partially detailed view of the internal structure of FIG. 4.
Figure 6:
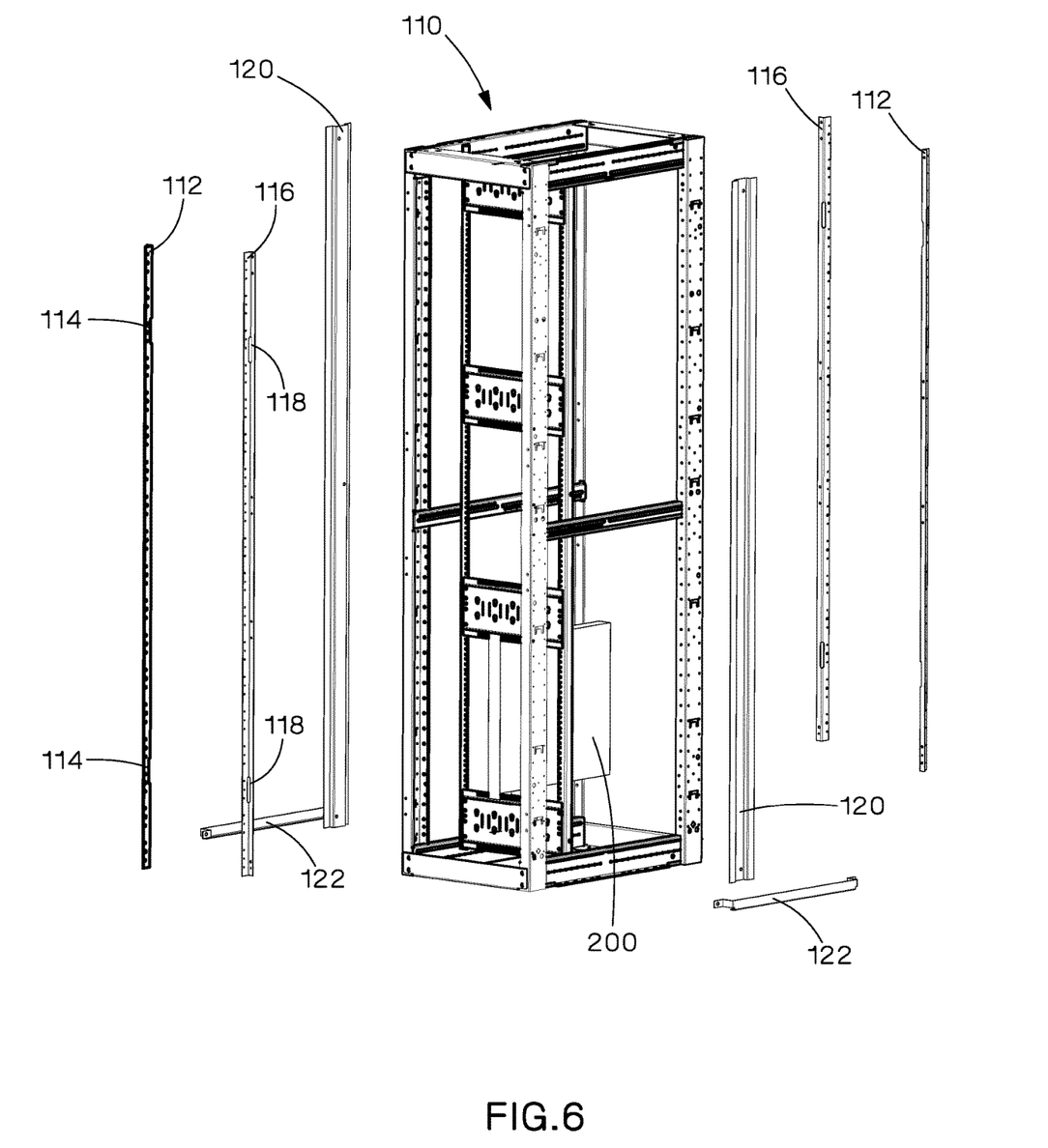
FIG. 6 is a partially exploded view of the internal structure of FIG. 4.

FIG. 5 is a detailed view of the bottom section of the internal structure 108 of FIG. 4. The internal structure 108 includes a support frame assembly 110 with left mounting brackets 112 and right mounting brackets 116 attached at the corners of the support frame assembly 110. The internal structure 108 also includes vertical panel supports 120 extending the height of the internal structure 108 and lower panel supports 122 extending the width of the internal structure 108. FIG. 6 illustrates the support frame assembly 110 with the left mounting bracket 112, the right mounting bracket 116, the vertical panel supports 120 and the lower panel supports 122 removed.

The side panels 102 are secured to the left and right mounting brackets 112, 116, respectively, with screws (not illustrated). The attachment points of the side panels 102 are hidden from view when the door assemblies 104 are in the closed position to contribute to a plain exterior appearance. The side panels 102 are also adhered to the top cover assembly 106, vertical panel supports 120, lower panel supports 122 and the support frame assembly 110 via adhesive foam tape to prevent audible vibration and eliminate the need for welding. Vertical panel supports 120 and lower panels supports 122 provide rigidity to the side panels 102 when adhered enabling the side panels 102 to maintain their flat shape and achieve sufficient strength without adding visible bends or other features that would compromise their plain appearance.

Figure 7:
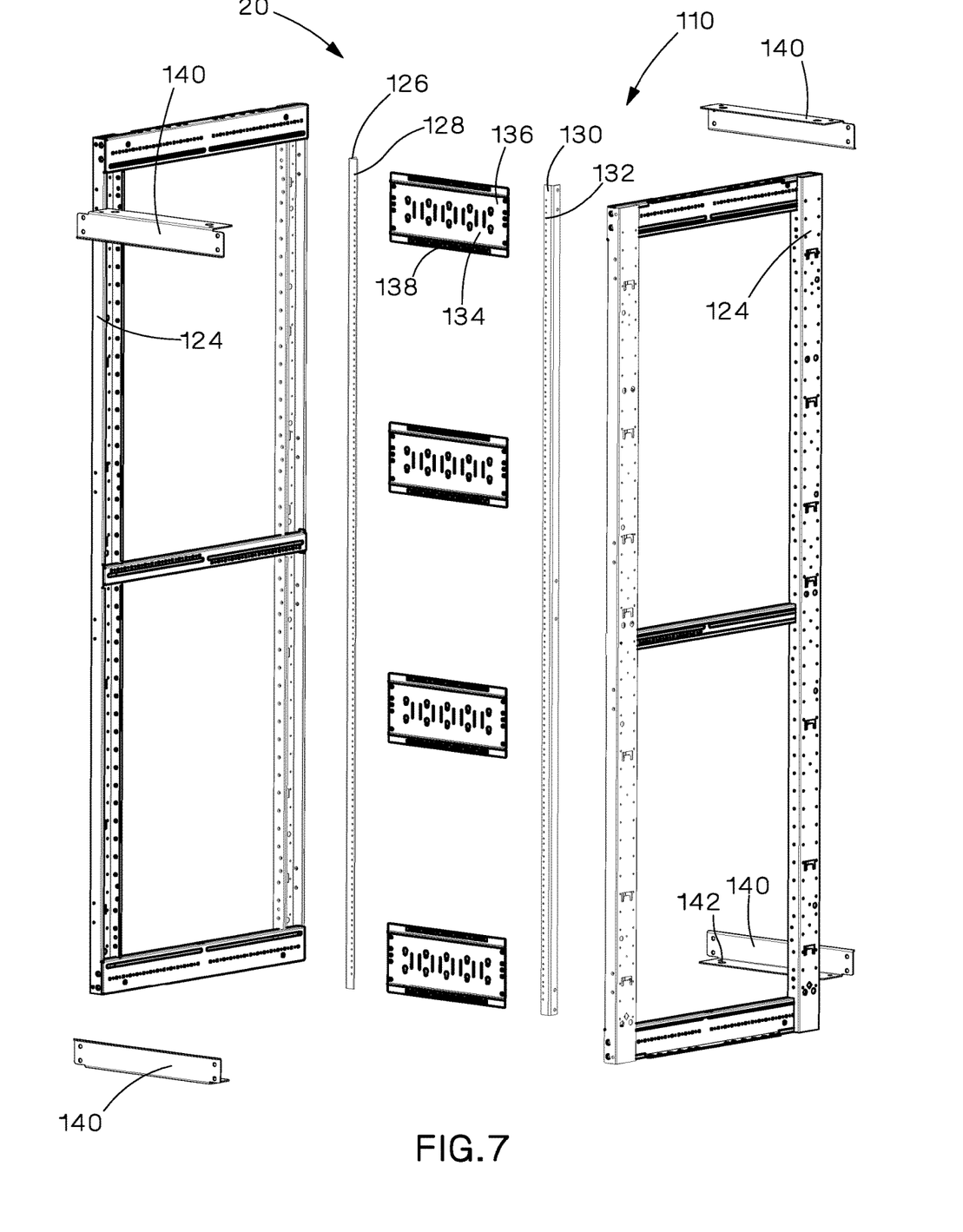
FIG. 7 is an exploded view of the support frame assembly of FIG. 6.

FIG. 7 illustrates an exploded view of the support frame assembly 110. The support frame assembly 110 includes rack side weldments 124, a left vertical rail 126, a right vertical rail 130, horizontal rails 134, and tie brackets 140. The support frame assembly 110 rests on the floor and is secured via bolts (not illustrated) through holes 142 in the tie brackets 140.

Figure 8:
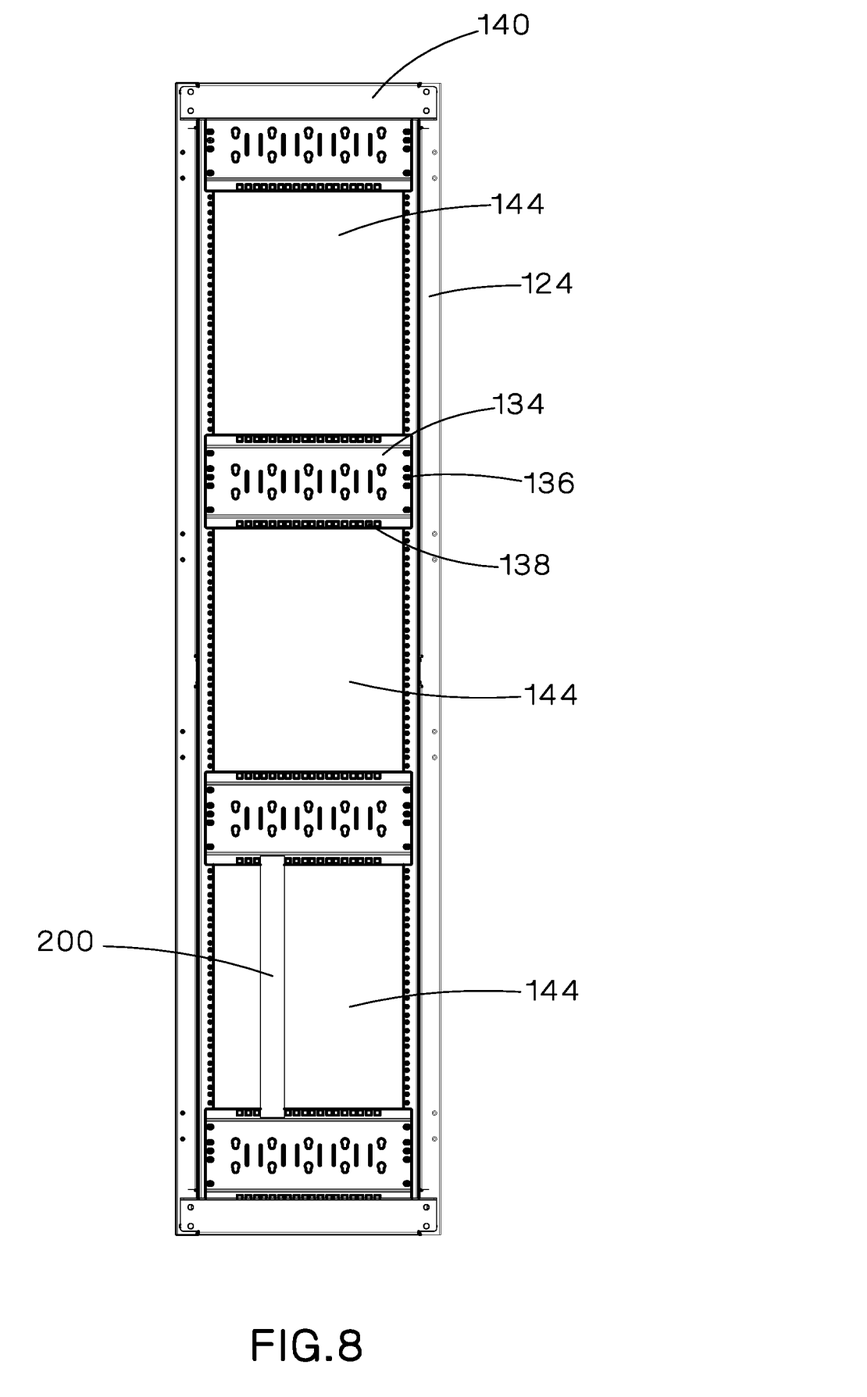
FIG. 8 is a front view of the support frame assembly of FIG. 6.
Figure 9:
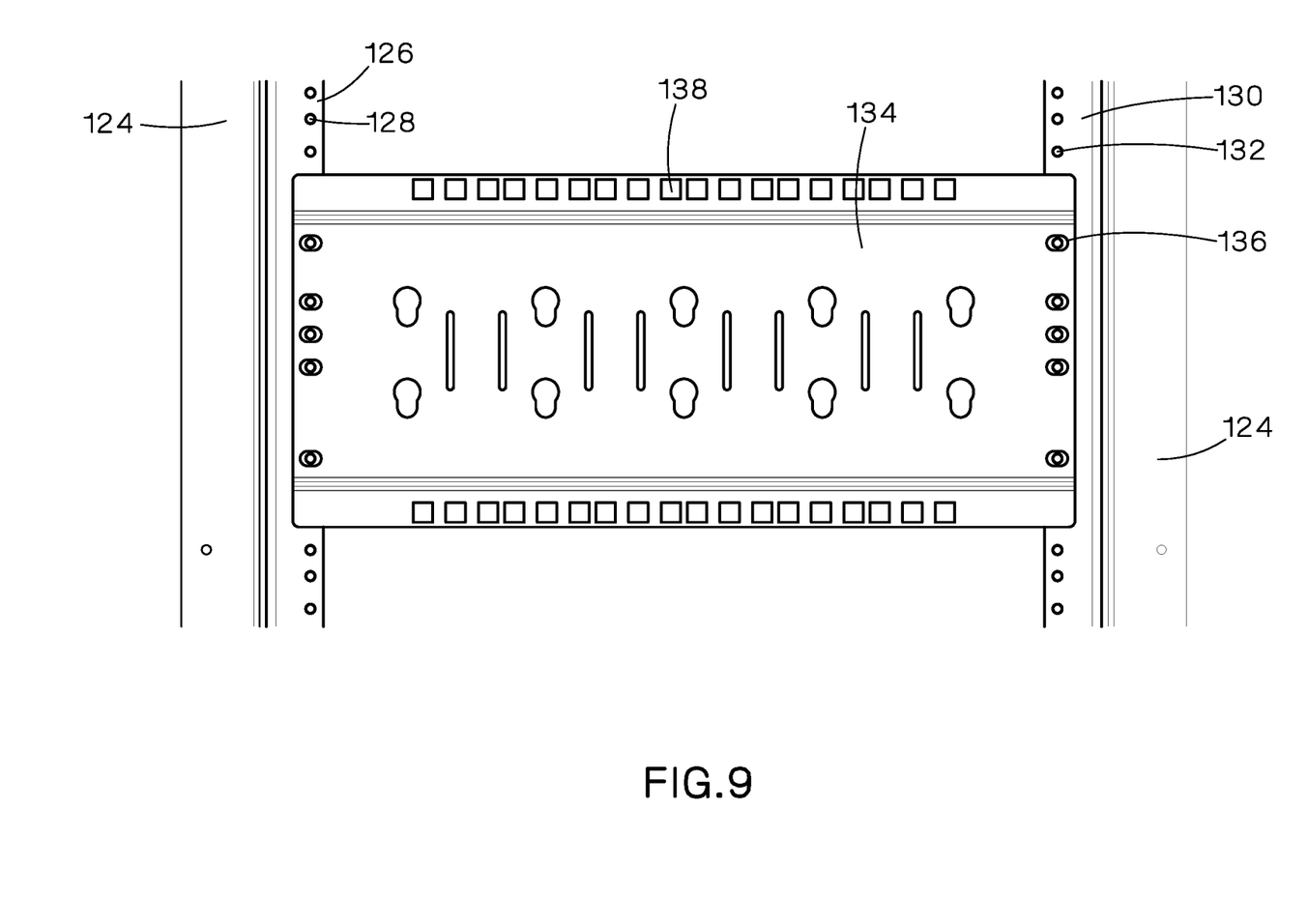
FIG. 9 is a detailed view of the horizontal rail of the support frame assembly of FIG. 8.

FIG. 8 illustrates the front of an assembled support frame assembly 110. The support frame assembly 110 includes a number of equipment mounting areas 144. FIG. 9 is a detailed view of one of the horizontal rails 134 of the support frame assembly 110 with a plurality of clearance holes or mounting holes 136 which are spaced per the vertical hole spacing standard of EIA-310. FIG. 9 also illustrates the left vertical rail 126 and the right vertical rail 130 with a plurality of threaded holes 128, 132, respectively, which are also spaced per the vertical hole spacing standard of EIA-310. The clearance holes 136 of the horizontal rail 134 align with the plurality of threaded holes 128, 132 in the left and right vertical rails 126, 130, respectively. Screws (not illustrated) attach the horizontal rails 134 to the left and right vertical rails 126, 130.

Each horizontal rail 134 includes a plurality of cage nut holes 138 which are also spaced per the vertical hole spacing standard of EIA-310. As a result, the left and right vertical rails 126, 130 support rack-mountable equipment 200 vertically, at a right angle to the intended, typical equipment mounting orientation. The vertical distance between the cage nut holes 138 and the clearance holes 136 allows multiple identical horizontal rails 134 to attach along the left vertical rail 126 and the right vertical rail 130 such that the vertical spacing of opposing cage nut holes 138 on adjacent horizontal rails 134 equals the EIA-310 rail to rail spacing standard (18.312 inches, center to center). The quantity of cage nut holes 138 allows for 6 rack mount units (RU) of capacity (per EIA-310) within each equipment mounting area 144, totaling 18 RU capacity for the faux column IDF enclosure 100.

The vertical orientation of network equipment 200 allows rack side weldments 124 to be spaced closer together horizontally than typical four-posts racks. The existing rack side weldments 124 allow left vertical rail 126 and right vertical rail 130 to translate forward and backward thus allowing the position of horizontal rails 134 to be adjusted by the end user by translating all connected rail components as a singular unit.

Figure 10:
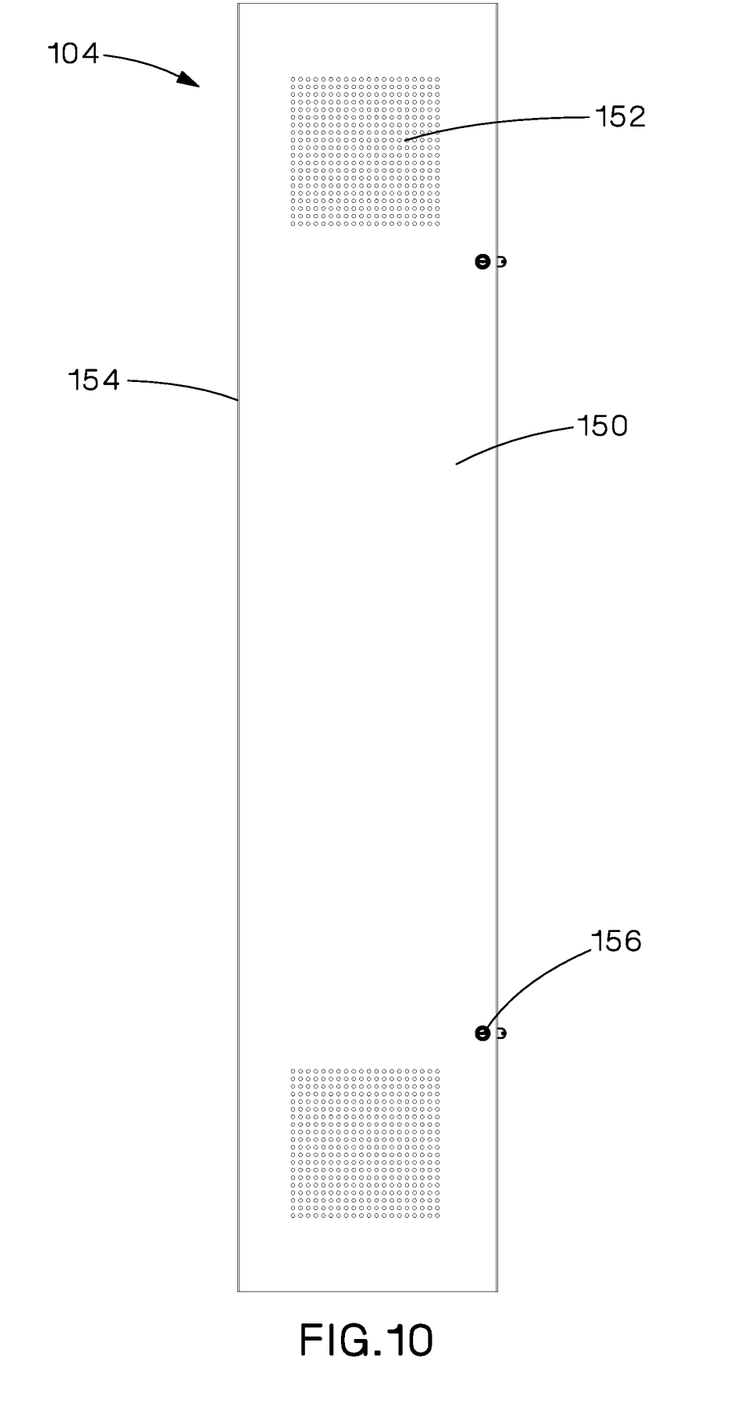
FIG. 10 is a front view of the door assembly of the faux column IDF enclosure of FIG. 3.
Figure 11:
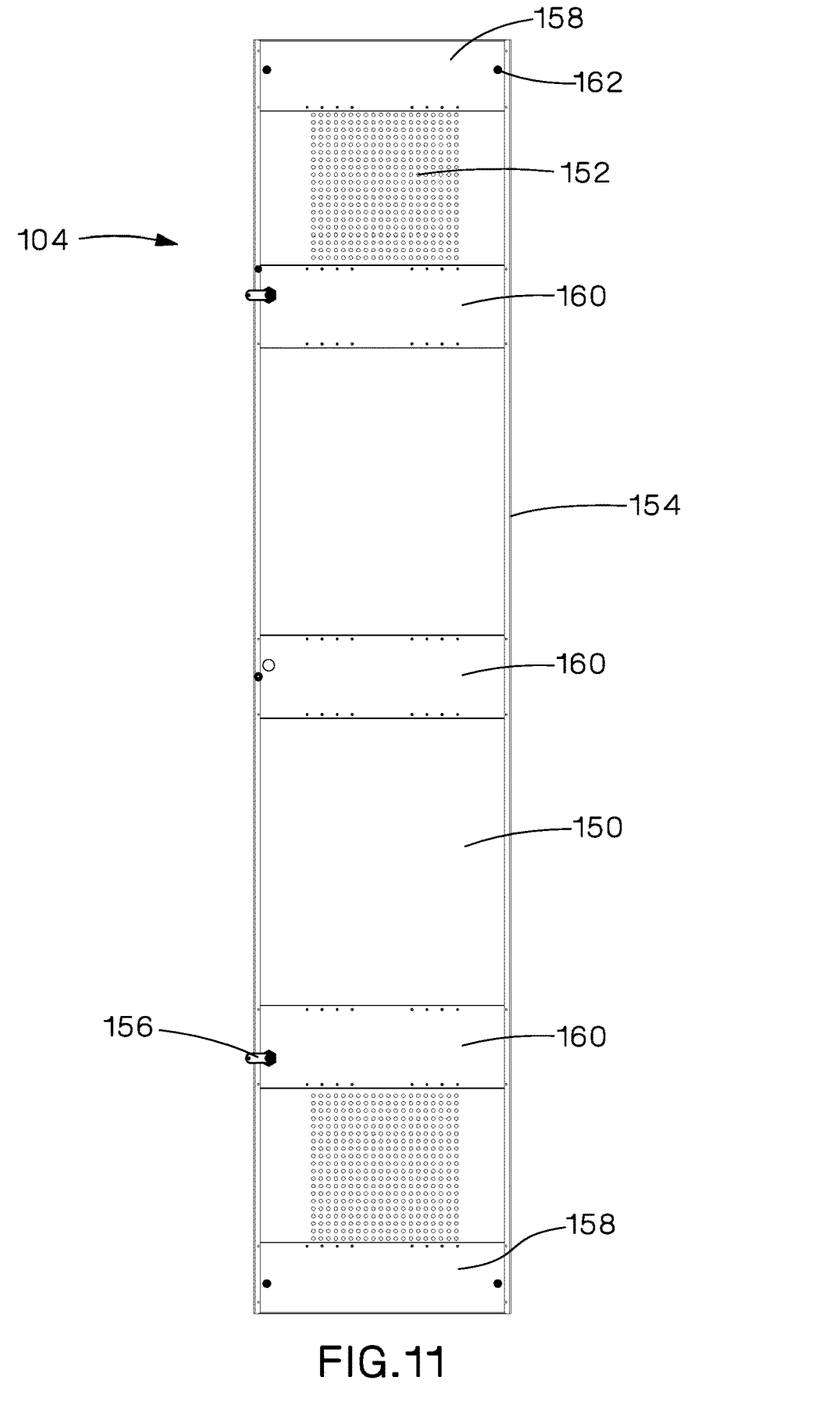
FIG. 11 is a rear view of the door assembly of FIG. 10.

FIGS. 10 and 11 illustrate the door assembly 104. The door assembly 104 includes a main body 150 with perforated vents 152, a door hinge 154, and keyed cam-latches 156. The inside of the main body 150 of the door includes end braces 158, middle braces 160, and rubber bumpers 162. The door hinge 154 attaches with screws to either left mounting bracket 112 or right mounting bracket 116 by rotating the door assembly 104 180 degrees to allow the main body 150 to swing open in the direction desired by the end user. The left mounting brackets 112 and the right mounting brackets 116 have slots 114, 118, respectively, that are engaged by keyed cam-latches 156 to hold the door assembly 104 in the closed position when mounted in either orientation. Rubber bumpers 162 contact support frame assembly 110 while door assembly 104 is in the closed positioned to prevent over rotation of the door hinge 154 while the door is closed and to prevent audible vibration.

Figure 12:
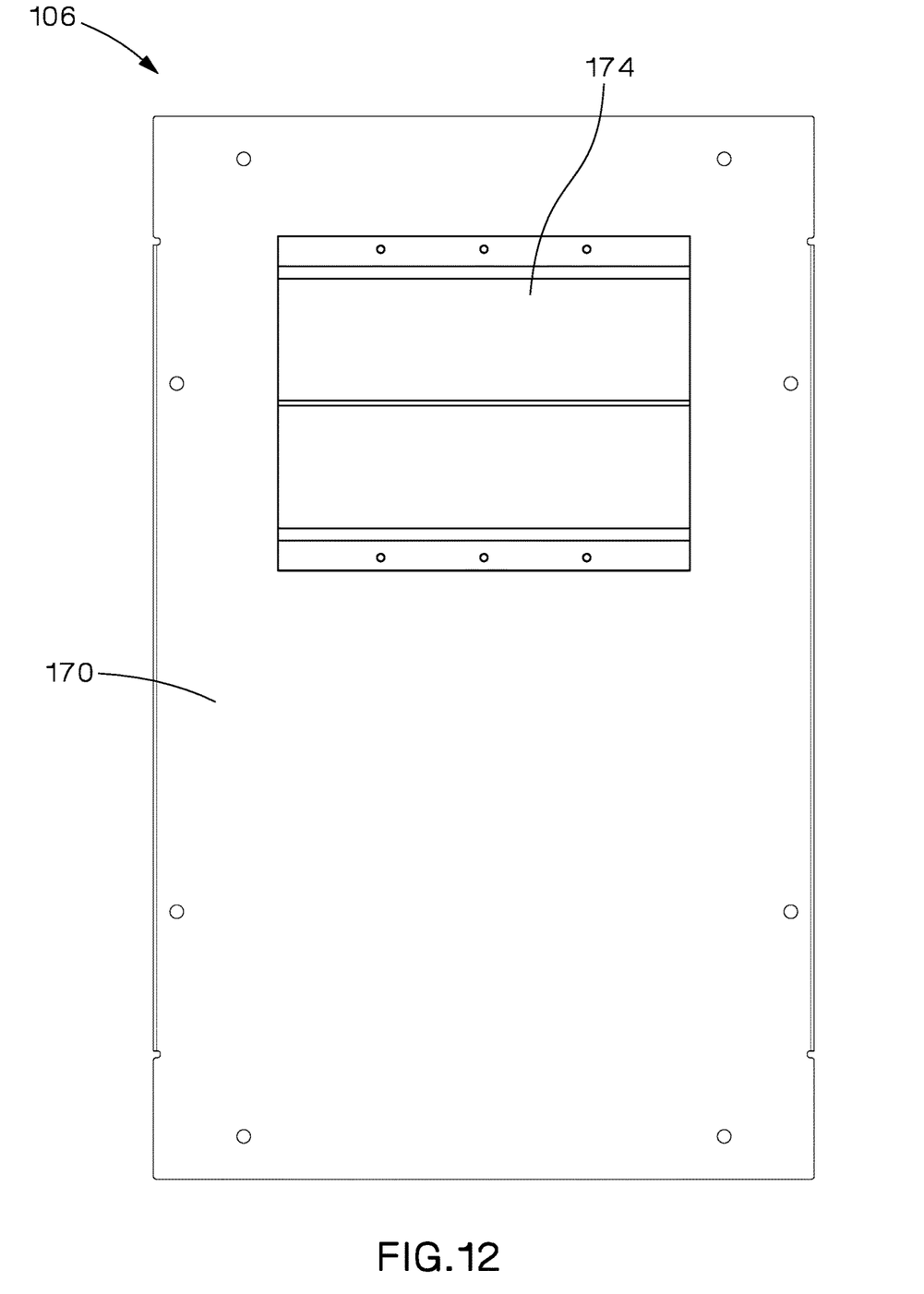
FIG. 12 is a top view of the top cover assembly of the faux column IDF enclosure of FIG. 3.
Figure 13:
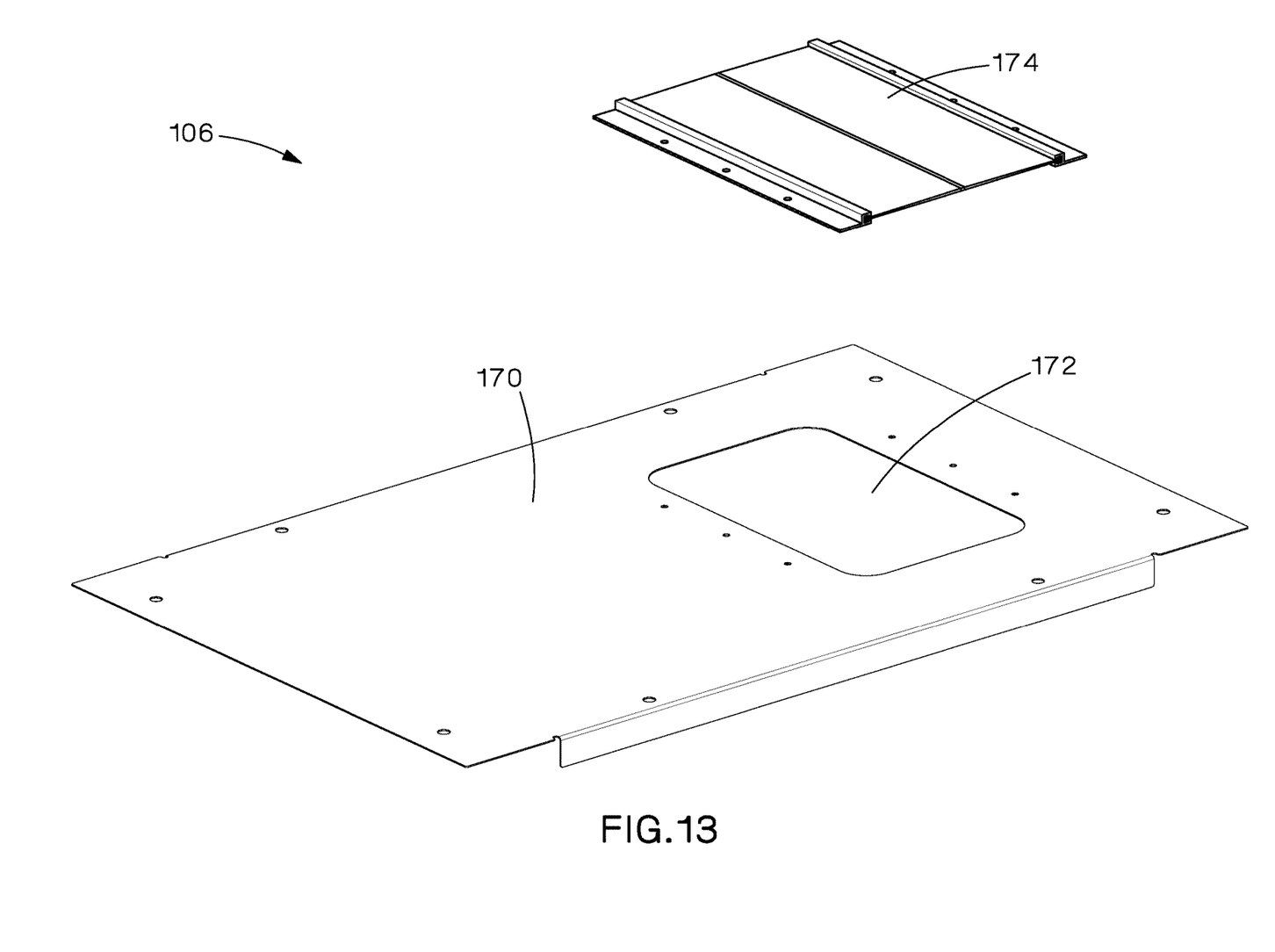
FIG. 13 is an exploded top view of the top cover assembly of FIG. 12.

FIGS. 12-13 illustrate the top cover assembly 106 of the faux column IDF enclosure 100. The top cover assembly 106 includes a top cover panel 170 and a brushed pass through assembly 174. The top cover panel 170 includes a centered entry hole 172. The entry hole 172 is designed to receive the brushed pass through assembly 174. As illustrated in FIGS. 1 and 2, a cable bundle 30 passes through the brushed pass-through assembly 174 and through the entry hole 172 in the top cover panel 170 to enter the faux column IDF enclosure 100. The brushed pass through assembly 174 blocks air flow around the cable bundle 30 so air flow can only enter or exit the faux column IDF enclosure 100 through the perforated vents 152.

Figure 14:
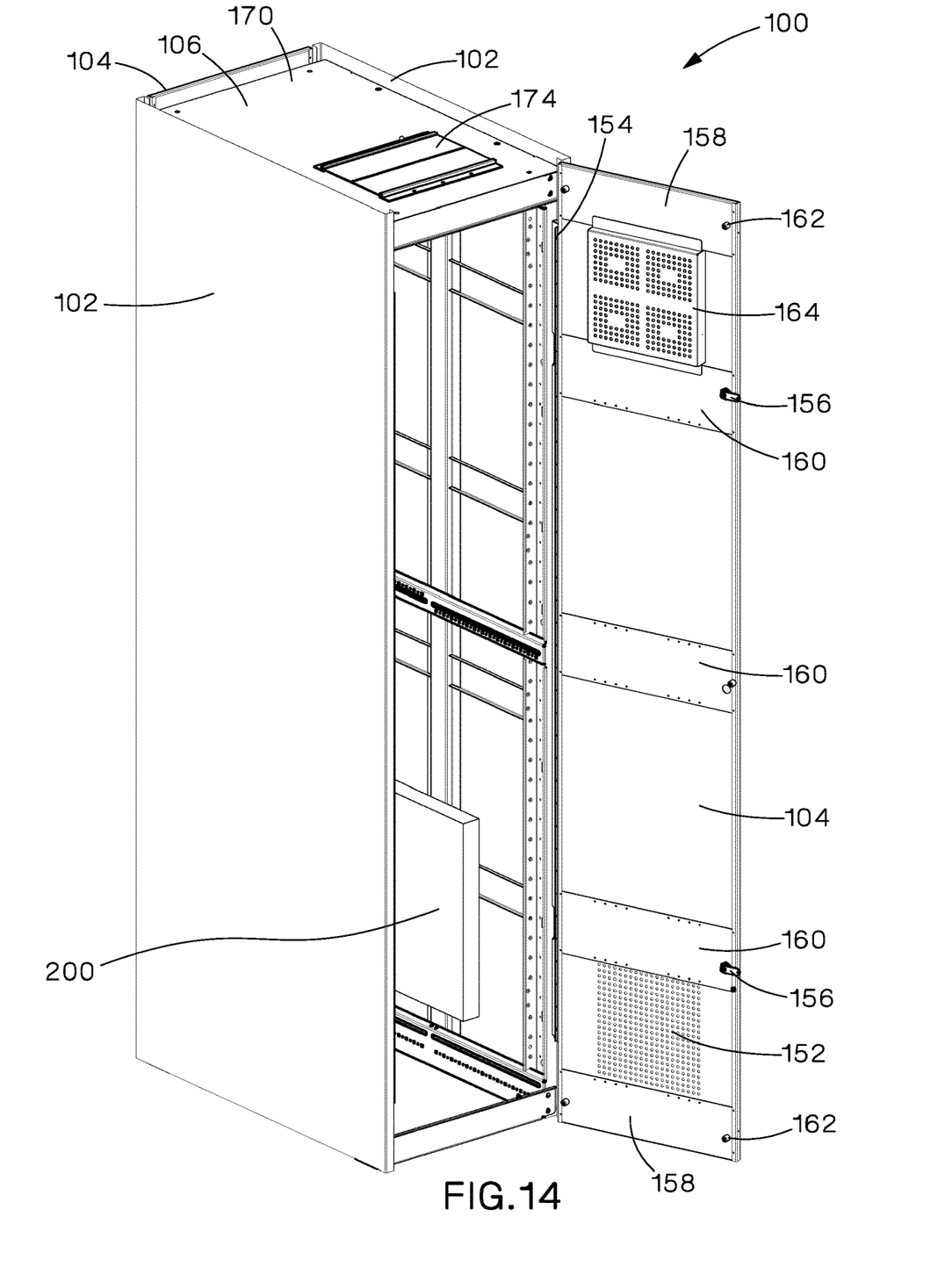
FIG. 14 is a rear view of the enclosure of FIG. 3 with the door assembly in an open position.

FIG. 14 illustrates the faux column IDF enclosure 100 with the rear door assembly 104 opened. An exhaust fan 164 is secured to the rear door main body 150 to evacuate the hot air generated by the network equipment 200 out of the faux column IDF enclosure 100 through the upper perforated vent 152. Cooler air enters the faux column IDF enclosure 100 through the perforated vents 152 on the front door assembly 104 and the remaining perforated vent 152 on the rear door assembly 104.

The vertical standing lockable faux column IDF enclosure of the present invention encases and secures rack-mountable networking equipment and network cabling while ventilating the heat generated by the equipment. The networking equipment is vertically mounted inside the faux column IDF enclosure to allow for a smaller overall width as compared to existing rack and cabinet products. The faux column IDF enclosure resembles a rectangular building column with a plain, flat, and rectangular appearance having minimal lines and features visible from the exterior.

Furthermore, while the particular preferred embodiments of the present invention have been shown and described, it will be obvious to those skilled in the art that changes and modifications may be made without departing from the teaching of the invention. The matter set forth in the foregoing description and accompanying drawings is offered by way of illustration only and not as limitation.

The invention claimed is:

1. An enclosure assembly for encasing network equipment, the enclosure assembly comprising; an internal structure having a support frame assembly defined by a left rack side weldment and a right rack side weldment; the left rack side weldment and the right rack side weldment are joined to each other by tie brackets; a left vertical rail secured to an inner side of the left rack side weldment; a right vertical rail secured to an inner side of the right rack side weldment; a plurality of horizontal rails extending between the left vertical rail and right rail vertical rail to be secured to the left vertical rail and the right vertical rail simultaneously; wherein each horizontal rail of the plurality of horizontal rails includes a plurality of cage nut holes and a plurality of mounting holes; the plurality of cage nut holes are positioned along a top of the horizontal rails and along a bottom of the horizontal rails; and the plurality of mounting holes are positioned along a left side of the horizontal rails and along a right side of the horizontal rails; a plurality of equipment mounting areas defined by the left vertical rail, the right vertical rail, and the plurality of horizontal rails; and network equipment vertically mounted in one of the equipment mounting areas of the plurality of equipment mounting areas to two of the horizontal rails.

2. The enclosure assembly of claim 1, wherein the left vertical rail and the right vertical rail have a plurality of threaded spaced apart holes; wherein the mounting holes of the horizontal rails align with the threaded holes of the left vertical rail and threaded holes of the right vertical rail when the horizontal rails are secured to the left vertical rail and the right vertical rail.

3. The enclosure assembly of claim 2, wherein the cage nut holes in the horizontal rails provide capacity for six rack mount units within each equipment mounting area.

4. The enclosure assembly of claim 1, wherein the left rack side weldment and the right rack side weldment allow the left vertical rail and the right vertical rail to translate forward and backward in the enclosure assembly.

5. The enclosure assembly of claim 4, wherein a position of the horizontal rails within the enclosure assembly is adjustable by translating the connected left vertical rail, the right vertical rail, and the horizontal rails as a single unit.

6. The enclosure assembly of claim 1, wherein the vertically mounted network equipment allows the left rack side weldment and the right rack side weldment to have reduced horizontal spacing.

7. The enclosure assembly of claim 1, wherein the internal structure further comprising mounting brackets attached at corners of the left rack side weldment and at corners of the right rack side weldment;

vertical panel supports secured to an outer side of the left rack side weldment and an outer side of the right rack side weldment, the vertical panel supports extending a height of the internal structure; and lower panel supports secured to the outer side of the left rack side weldment and the outer side of the right rack side weldment, the lower panel supports extending a width of the internal structure.

8. The enclosure assembly of claim 7, further comprising side panels covering sides of the internal structure; the side panels are secured to the mounting brackets by fasteners; and the side panels are secured to the vertical panel supports and the lower panel supports by adhesive foam tape for preventing audible vibration; whereby the vertical panel supports and the lower panel supports provide rigidity to the side panels when adhered to enable the side panels to maintain a flat shape.

9. The enclosure assembly of claim 8, further comprising a front door assembly hingedly secured to one of the mounting brackets and a rear door assembly hingedly secured to one of the mounting brackets.

10. The enclosure assembly of claim 9, wherein attachment points of the side panels are hidden from view when the door assemblies are in a closed position to provide a plain exterior appearance.

11. The enclosure assembly of claim 9, wherein the front door assembly includes a main body with perforated vents and the rear door assembly includes a main body with perforated vents.

12. The enclosure assembly of claim 11, further comprising an exhaust fan secured to the main body of the rear door assembly, the exhaust fan evacuates hot air generated by the network equipment out of the enclosure assembly though the perforated vent in the rear door assembly.

13. The enclosure assembly of claim 12, wherein the perforated vents in the main body of the front door assembly and the perforated vents in the main body of the rear door assembly control a horizontal air flow into the enclosure assembly; and the exhaust fan on the main body of the rear door assembly controls the horizontal air flow out of the enclosure assembly.

14. The enclosure assembly of claim 1, further comprising a top cover assembly covering a top of the internal structure, the top cover assembly includes a top cover panel with an entry hole and a brushed pass through assembly positioned over the entry hole, wherein the brushed pass through assembly blocks air flow around a cable bundle exiting the enclosure assembly through the top cover panel.

15. The enclosure assembly of claim 14, further comprising a vertical extension secured to the top of the internal structure, the vertical extension hides the cable bundle extending from the enclosure assembly.

16. The enclosure assembly of claim 1, further comprising at least one vertical extension for hiding network cable bundles extending above the enclosure assembly, the at least one vertical extension having a shell with an upper indentation that extends around a perimeter of the shell and a lower projection that extends around the perimeter of the shell.

17. The enclosure assembly of claim 16, wherein an outer appearance of the at least one vertical extension matches the enclosure assembly for providing a column with continuous lines extending a height of the column.

18. The enclosure assembly of claim 1, wherein the support frame assembly is secured to a floor by fasteners through holes in the tie brackets.

* * * * *